(12) United States Patent
Fujikawa

(10) Patent No.: US 6,414,738 B1
(45) Date of Patent: Jul. 2, 2002

(54) DISPLAY

(75) Inventor: Shinsuke Fujikawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/171,813

(22) PCT Filed: Mar. 27, 1998

(86) PCT No.: PCT/JP98/01419

§ 371 (c)(1),
(2), (4) Date: Oct. 27, 1998

(87) PCT Pub. No.: WO98/44566

PCT Pub. Date: Oct. 8, 1998

(30) Foreign Application Priority Data

Mar. 31, 1997 (JP) .............................................. 9-081140

(51) Int. Cl.⁷ .......................... G02F 1/1343; H01L 23/48
(52) U.S. Cl. ........................ 349/147; 257/764; 257/770; 349/43
(58) Field of Search ........................ 349/42, 139, 143; 257/59, 72, 76, 770, 774, 763, 764

(56) References Cited

U.S. PATENT DOCUMENTS

| | | | | |
|---|---|---|---|---|
| 5,640,067 A | * | 6/1997 | Yamaguchi et al. | 33/504 |
| 5,650,664 A | * | 7/1997 | Sakamoto | 257/64 |
| 5,978,056 A | * | 11/1999 | Shintani et al. | 349/137 |
| 6,031,290 A | * | 2/2000 | Miyazaki et al. | 257/764 |
| 6,049,132 A | * | 4/2000 | Iwahashi et al. | 257/763 |
| 6,051,883 A | * | 4/2000 | Nakamura | 257/768 |

FOREIGN PATENT DOCUMENTS

| | | |
|---|---|---|
| JP | A-61-144872 | 7/1986 |
| JP | A-1-241860 | 9/1989 |
| JP | A-2-15620 | 1/1990 |
| JP | 5-235360 | * 9/1993 |
| JP | A-5-235360 | 9/1993 |
| JP | A-6-120355 | 4/1994 |
| JP | A-7-263589 | 10/1995 |
| JP | A-7-297147 | 11/1995 |
| JP | A-9-265114 | 10/1997 |
| JP | 9-307113 | * 11/1997 |
| JP | A-9-307113 | 11/1997 |

* cited by examiner

Primary Examiner—Kenneth Parker
(74) Attorney, Agent, or Firm—Oliff & Berridge PLC

(57) ABSTRACT

In a display device such as a liquid crystal display device, in order to connect electrodes and wiring with a low resistance, the first titanium nitride film 14 having a hexagonal crystal structure for preventing silicon diffusion is intervened between the drain region 5 composed of a polycrystalline silicon film and the drain electrode 9 composed of an aluminum film. The second titanium nitride film 15 having a hexagonal crystal structure which can be deposited by sputtering with the same target as that for the titanium film 13 and the first titanium film 14 is intervened between the transparent display electrode 12 composed of an ITO film and the drain electrode 9 composed of an aluminum film in order to bring them into ohmic contact. Since the second titanium nitride film 15 is resistant to an etchant for the silicon oxide film and to an etchant for the ITO film, the drain electrode 9 is protected when etching is performed.

5 Claims, 8 Drawing Sheets (A)

(B)

DISPLAY

BACKGROUND OF THE INVENTION

1. Field of Invention

The present invention relates to display devices such as liquid crystal display devices which perform display by controlling a state of liquid crystal enclosed between substrates, or current-controlled display devices which perform display by making EL (electroluminescence) devices and LED (light-emitting diode) devices emit light by means of driving current. More particularly, the present invention relates to electrical connect techniques of conductive films constituting the electrodes and wiring in the display devices described above.

2. Description of Related Art

In display devices such as liquid crystal display devices and current-controlled display devices, display is controlled by using switching elements such as thin film transistors. Although transparent substrates are used as supports in such display devices, when general-purpose glass is used as the transparent substrate, the fabrication process of panels must be performed at low temperatures. Accordingly, recently, liquid crystal display devices and the like which use a polycrystalline silicon thin film transistor (hereinafter referred to as TFT) are actively developed.

In a polycrystalline silicon TFT fabricated by the low-temperature process, as shown in FIG. 8, island-like polycrystalline silicon films 2 are formed on a substrate 1, and a channel region 4, a source region 3, and a drain region 5 are formed on the island-like polycrystalline silicon films 2. A gate electrode 7 faces the channel region 4 with a gate oxide film 6 composed of a silicon oxide film therebetween. A TFT30 configured as described above is covered with a first interlevel insulating film 10 composed of a silicon oxide film. Contact holes 101 and 102 are opened through the first interlevel insulating film 10 at the positions corresponding to the source region 3 and the drain region 5. A source electrode 8 and a drain electrode 9 composed of aluminum or an aluminum alloy are electrically connected to the source region 3 and the drain region 5, respectively, through the contact holes 101 and 102.

Also, a second interlevel insulating film 11 composed of a silicon oxide film is formed on the front surface of the source electrode 8 and the drain electrode 9, and a contact hole 103 is made through the second interlevel insulating film 11 at the position corresponding to the drain electrode 9. Thus, a transparent display electrode 12 composed of an ITO film is electrically connected to the drain electrode 9 through the contact hole 103 in the second interlevel insulating film 11. Since the drain electrode 9 composed of an aluminum film and the transparent display electrode 12 composed of an ITO film are not electrically connected well to each other, by intervening a contact metal 17 composed of a molybdenum film (Mo) or the like between the drain electrode 9 and the transparent display electrode 12, the drain electrode 9 and the transparent display electrode 12 are in ohmic contact with each other.

However, in the configuration shown in FIG. 8, when the anneal process is performed after wiring layers such as the source electrode 8 and the drain electrode 9 are formed on the source region 3 and the drain region 5 composed of polycrystalline silicon, it has been found that contact failure occurs between the source electrode 8 and the source region 3 and between the drain electrode 9 and the drain region 5. That is, silicon in the polycrystalline silicon film diffuses into the aluminum film at the electrical connection (joining area) between the drain region 5 composed of the polycrystalline silicon film and the drain electrode 9 composed of the aluminum film, and thus, contact resistance increases. The contact resistance increases remarkably when the anneal process is performed at a temperature of 300° C. or more after wiring layers such as the source electrode 8 and the drain electrode 9 are formed on the source region 3 and the drain region 5 composed of polycrystalline silicon. Such contact failure, which prevents a circuit from operating normally, results in display failure of pixels, which is a fatal defect in the case of a liquid crystal display device. However, in the known art, the problem of silicon diffusion into the aluminum alloy could not be solved completely.

Also, with respect to the method for bringing the drain electrode 9 composed of an aluminum film into ohmic contact with the transparent display electrode 12 composed of an ITO film, there has been only one method of intervening a metal film such as molybdenum, and freedom in design and process of liquid crystal display devices was limited.

SUMMARY OF THE INVENTION

In view of the problems described above, it is an object of the present invention to provide a new configuration of display devices such as liquid crystal display devices, in which electrodes and wiring can be connected with a low resistance.

DISCLOSURE OF INVENTION

In order to achieve the object described above, in accordance with the present invention, a display device having a first electrical connection between a polycrystalline silicon film and an aluminum film includes a first titanium nitride film provided between the polycrystalline silicon film and the aluminum film.

In the present description, an aluminum film means a film composed of aluminum alone and also means an aluminum alloy film including aluminum as a major constituent.

In accordance with the present invention, the first titanium nitride film intervenes between the polycrystalline silicon film and the aluminum film, and the first titanium nitride film functions as a diffusion-prevention film. That is, silicon does not diffuse from the polycrystalline silicon film into the aluminum film even if the anneal process is performed at a high temperature of 300° C. or more after a wiring layer composed of the aluminum layer is formed on the polycrystalline silicon. Accordingly, the contact resistance at this portion can be maintained at a low level.

Also, in accordance with the present invention, preferably a second titanium nitride film is provided between the aluminum film and the ITO film at a second electrical connection between the aluminum film and a transparent display electrode composed of an ITO film through a contact hole in an interlevel insulating film. In accordance with the present invention, at the second electrical connection, since the transparent display electrode composed of an ITO film and the aluminum film are electrically connected to each other with the second titanium nitride film therebetween, the transparent display electrode (ITO film) and the aluminum film can be brought into ohmic contact with each other. Also, since the second titanium nitride film is formed on the surface of the aluminum film, even if wet-etching using a hydrofluoric acid-based etchant is employed when making a contact hole into the interlevel insulating film, what is exposed on the bottom of the contact hole upon completion of etching is the second titanium nitride film which is resistant to the hydrofluoric acid-based etchant, not the aluminum film. Thus, when the contact hole is made into the interlevel insulating film, etching does not affect the aluminum film. Also, when patterning is performed onto the ITO film, even if the interlevel insulating film has cracks or the like, what is touched by a bromine-based etchant for etching the ITO film is the second titanium nitride film which is resistant to the bromine-based etchant, not the aluminum film. Thus, disconnection or the like does not occur in the aluminum film. Therefore, in accordance with the present embodiment, reliable liquid crystal display devices can be fabricated.

Also, if the same titanium nitride film is provided between the polycrystalline silicon film and the aluminum film and between the aluminum film and the transparent display electrode (ITO film), deposition can be performed with the same target when the sputtering process is used for deposition. Therefore, as targets for sputtering deposition, two targets only are required, that is, a target for forming the aluminum film and a target for forming the titanium nitride (titanium) film.

In the configuration described above, preferably the first titanium nitride film and the second nitride film have the same film thickness and the same film characteristics. In such a configuration, stress caused by the first titanium nitride film to the aluminum film and stress caused by the second titanium nitride film to the aluminum film are substantially equal, and thus, the aluminum film is not forced unnecessarily. Therefore, defects such as cracks and separation do not occur in the first titanium nitride film, the aluminum film, the second titanium nitride film, and others. Also, since the first titanium nitride film for preventing diffusion and the second titanium nitride film, which is resistant to an etchant and which brings the ITO film and the aluminum film into ohmic contact, are formed under the same deposition conditions, the control of the conditions during deposition is facilitated.

In accordance with another embodiment of the present invention, a display device having a second electrical connection between an aluminum film and a transparent display electrode composed of an ITO film through a contact hole in an interlevel insulating film includes a second titanium nitride film provided between the aluminum film and the ITO film. In the present invention, a new material, i.e., a titanium nitride film, is presented in order to bring the ITO film and the aluminum film into ohmic contact with each other. The titanium nitride film, differing from a metal film, is resistant to the hydrofluoric acid-based etchant for making a contact hole into the interlevel insulating film, and is resistant to the bromine-based etchant for performing patterning to the ITO film, and thus, the aluminum film is protected. Therefore, freedom in design and process of liquid crystal display devices or the like will broaden.

In accordance with the present invention, preferably the first titanium nitride film and the second titanium nitride film are titanium nitride films having a hexagonal crystal structure. As mentioned above, if both titanium nitride films have a hexagonal crystal structure, since the first titanium nitride film for preventing diffusion and the second titanium nitride film, which is resistant to various etchants and capable of being in ohmic contact with the ITO, can be formed under the same deposition conditions, the control of the conditions during deposition is facilitated.

The present invention is applicable to a liquid crystal display device or the like in which the polycrystalline silicon film and the aluminum film are formed on either one of the substrates sandwiching liquid crystal.

When the display device of the present invention is fabricated, preferably after a titanium nitride film for constituting the first titanium nitride film is formed, an aluminum film is formed on the surface of the titanium nitride film, and then, patterning is performed simultaneously onto the aluminum film and the titanium nitride film to simplify the etching process.

When the display device of the present invention is fabricated, preferably after a titanium nitride film for constituting the first titanium nitride film is formed, an aluminum film is formed on the surface of the titanium nitride film, and a titanium nitride film for constituting the second titanium nitride film is formed on the surface of the aluminum film, and then, patterning is performed simultaneously onto the aluminum film and the titanium nitride films formed on the upper and lower surfaces of the aluminum film to simplify the etching process.

When the display device of the present invention is fabricated, preferably after the aluminum film is formed, a titanium nitride film for constituting the second titanium nitride film is formed, and then patterning is performed simultaneously onto the aluminum film and the titanium nitride film to simplify the etching process.

DETAILED DESCRIPTION OF PREFERRED EMBODIMENTS

A liquid crystal display device to which the present invention is applied will be described with reference to the drawings.

(General Configuration of Liquid Crystal Display Device)

Figure 1:
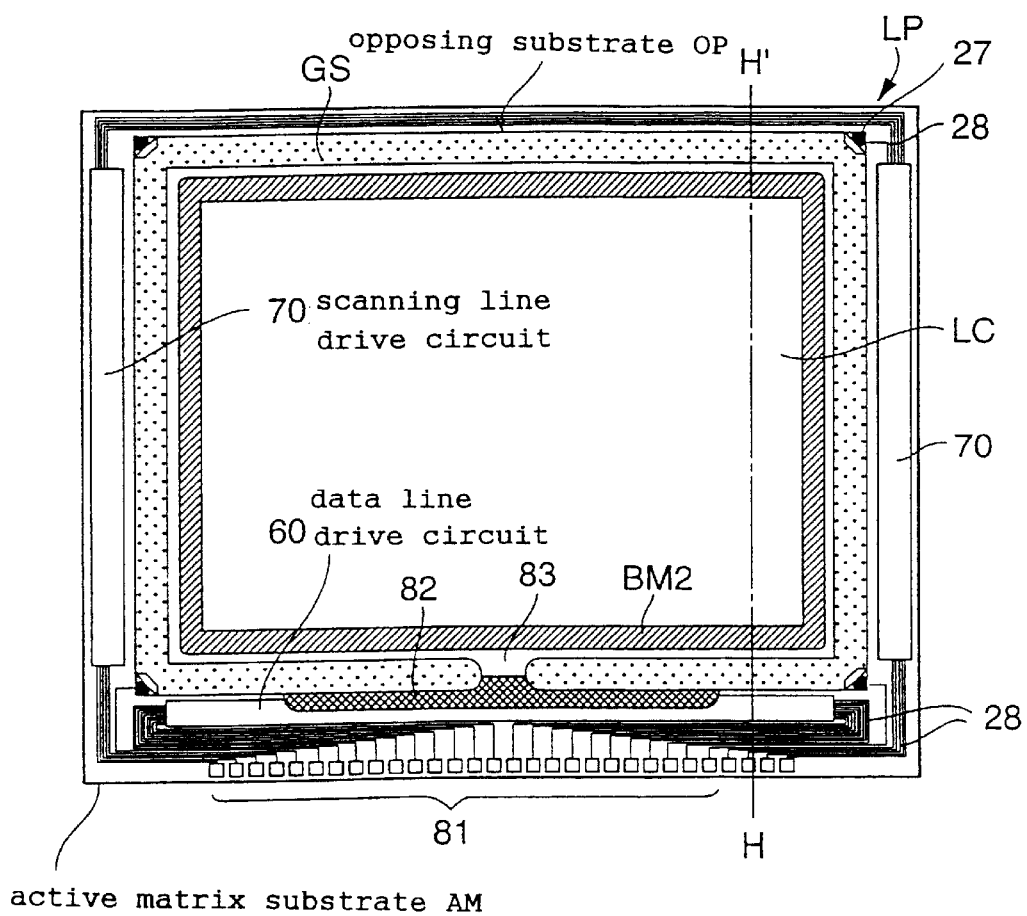
FIG. 1 is a plan view of a liquid crystal display device as an example of a display device.
Figure 2:
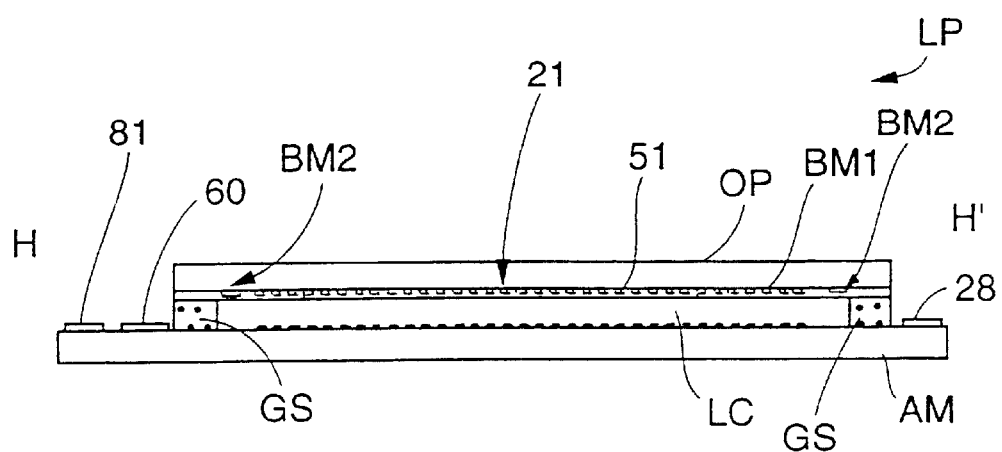
FIG. 2 is a sectional view taken along the line H–H' of FIG. 1.

FIG. 1 and FIG. 2 are a plan view of a liquid crystal display device and a sectional view taken along the line H–H' of FIG. 1, respectively.

In FIG. 1 and FIG. 2, the liquid crystal display device LP includes a rectangular screen display area 21 formed substantially in the center, a data line drive circuit 60 formed in the periphery of the screen display area 21, an active matrix substrate AM provided with one pair of scanning line drive circuits 70 formed on both sides of the screen display area 21, and an opposing substrate OP which is placed opposite to the active matrix substrate AM.

The opposing substrate OP and the active matrix substrate AM are bonded to each other with a given space therebetween by a sealing material GS containing a gap material formed along the periphery of the screen display area 21 between the screen display area 21 and the data line drive circuit 60, and the scanning line drive circuit 70. Also, in the space between the opposing substrate OP and the active matrix substrate AM, interior to the sealing material GS, liquid crystal LC is enclosed. Since the sealing material GS is partially interrupted, the interruption constitutes an injection port 83. Thus, in the liquid crystal display device LP, after the opposing substrate OP and the active matrix substrate AM are bonded to each other, if the area interior to the sealing material GS is decompressed, the liquid crystal LC can be injected with low pressure. After the liquid crystal LC is injected, the injection port 83 is closed with an end-sealing material 82. As the sealing material GS, an epoxy resin and various ultraviolet curing resins can be used, and as the gap material which is blended therewith, cylindrical glass fibers having a diameter of approximately 2 μm to 6 μm or the like can be used.

Since the opposing substrate OP is smaller than the active matrix substrate AM, the peripheral area of the active matrix substrate AM sticks out when bonded together. The scanning line drive circuit 70 and the data line drive circuit 60 are placed exterior to the opposing substrate OP, and do not face the opposing substrate OP.

The active matrix substrate AM is provided with, on the surrounding area of the data line drive circuit 60, a large number of external input/output terminals 81 composed of conductive films such as a metal film, for example, an aluminum film, a metal silicide film, or an ITO film to which a constant power source, modulating image signals, and various signals are input. A plurality of signal wires 28 composed of an aluminum film are extracted from the external input/output terminals 81 in order to operate the scanning line drive circuit 70 and the data line drive circuit 60.

The opposing substrate OP is provided with opposing electrodes 51 composed of an ITO film which face pixel electrodes of the individual pixels formed on the side of the active matrix substrate AM, and a black matrix BM1 composed of a shading film formed so as to surround the individual pixels. Also, the opposing substrate OP is provided with a shading film BM2 for parting the screen along the internal circumference of the sealing material GS.

On the periphery of the active matrix substrate AM, a vertical conduction terminal 27 is formed in an area corresponding to a corner of the screen display area 21 in the region in which the sealing material GS is formed. By means of a vertical conduction material 29 composed of silver point balls sandwiched between the active matrix substrate AM and the opposing substrate OP on the vertical conduction terminal 27, common electric potential is fed from the active matrix substrate AM to the opposing electrodes 51 on the opposing substrate OP.

(Configuration of Active Matrix Substrate and Screen Display Area)

Figure 3:
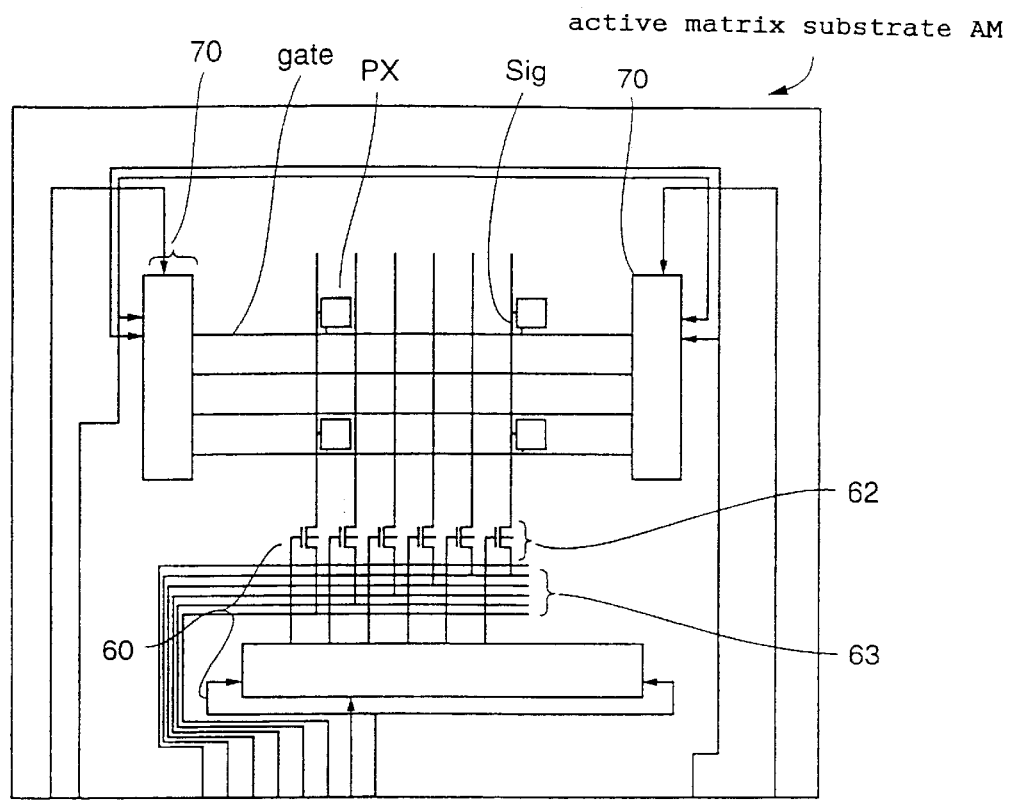
FIG. 3(A) is a block diagram showing the configuration of the liquid crystal display device shown in FIG. 1.
FIG. 3(B) is an equivalent circuit diagram showing the configuration of the pixels in this liquid crystal display device.
Figure 3:
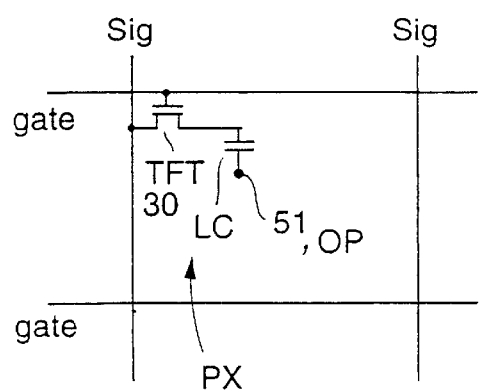

FIG. 3 is a block diagram of the active matrix substrate with built-in drive circuits used for the liquid crystal display device.

On the active matrix substrate AM, a plurality of pixels PX are configured in a matrix with a plurality of scanning lines gate and a plurality of data lines sig. Each pixel PX is provided with a TFT 30 for switching pixels which is connected to the plurality of scanning lines gate and the plurality of data lines sig. Also, the data line drive circuit 60 is provided with a plurality of image signal wires 63 and analog switches 62 for controlling the supply of image signals from image signal wires 63 to the data lines sig.

Figure 4:
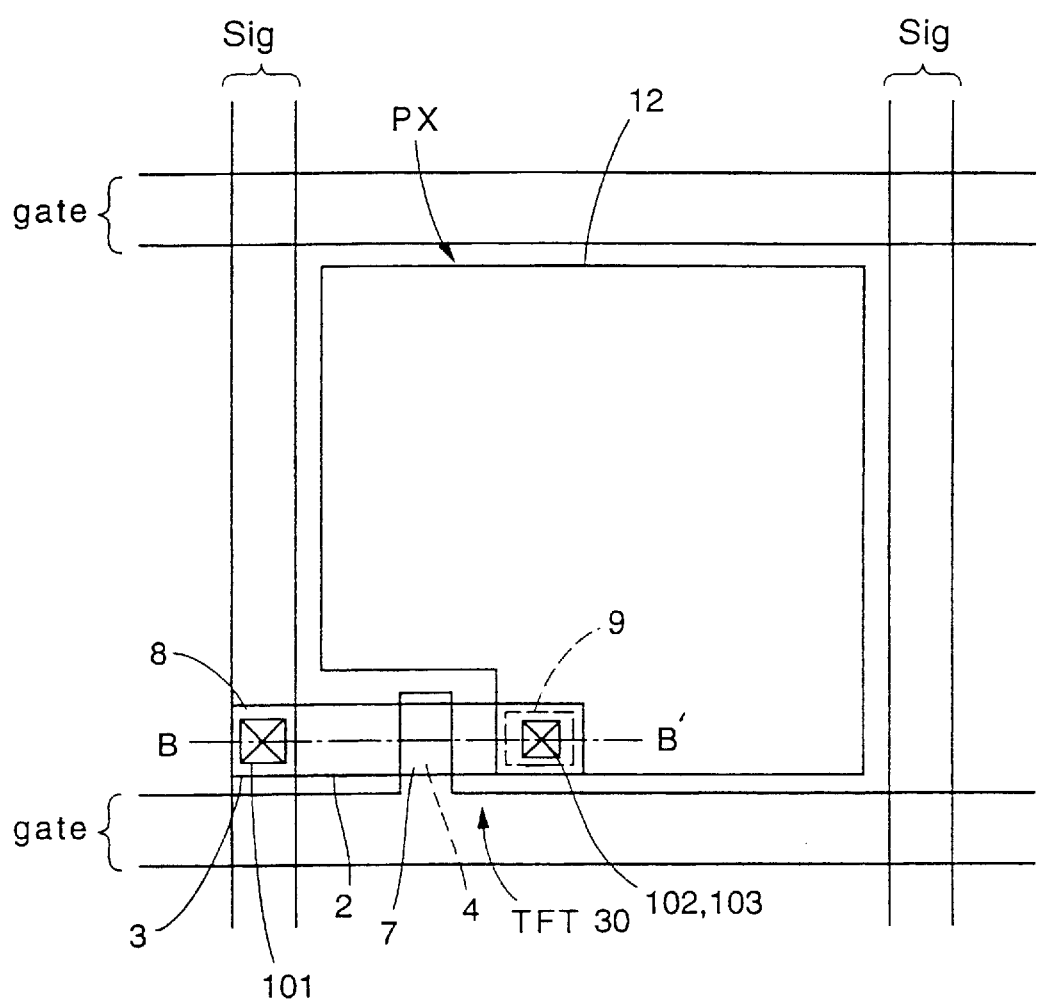
FIG. 4 is a plan view of the pixels in the liquid crystal display device shown in FIG. 1.
Figure 5:
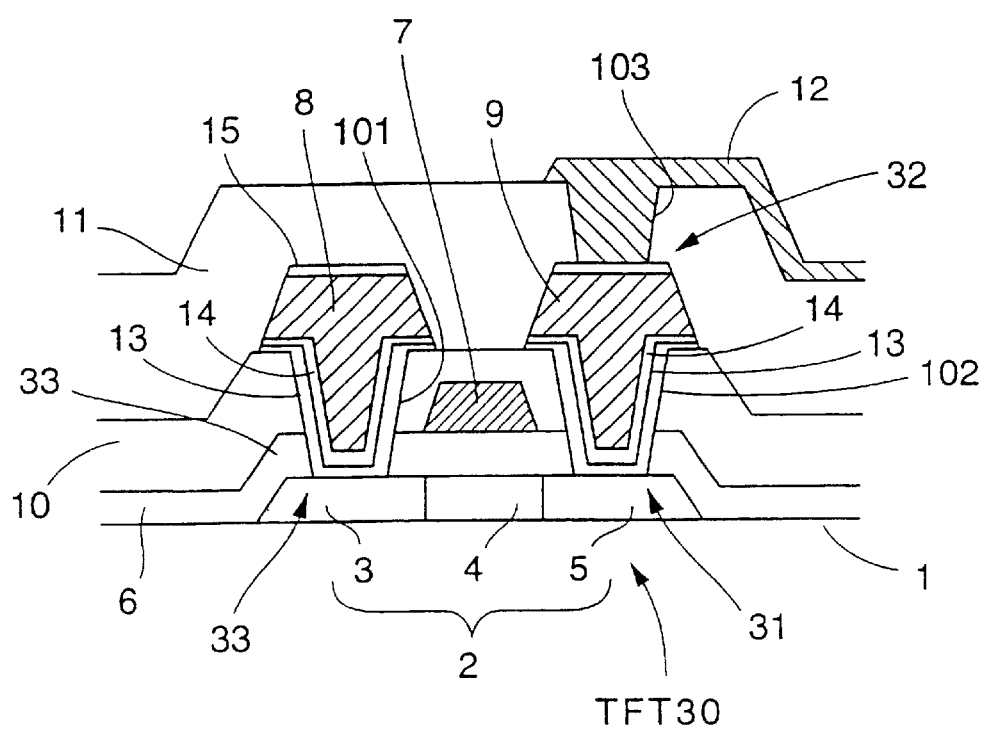
FIG. 5 is a sectional view taken along the line B–B' of FIG. 4.

The TFT30 for switching pixels is a polycrystalline silicon TFT fabricated by the low-temperature process, and its plan view and sectional view are shown in FIG. 4 and FIG. 5, respectively.

As shown in FIG. 4 and FIG. 5, the TFT30 for switching pixels includes an island-like polycrystalline silicon film 2 formed on a substrate 1. A channel region 4, a source region 3, and a drain region 5 are formed on the island-like polycrystalline silicon film 2. Also, the channel region 4 is opposed to a gate electrode 7 (a portion of the scanning line gate) with a gate oxide film 6 composed of a silicon oxide film therebetween. The TFT30 configured as described above is covered with a first interlevel insulating film 10 composed of a silicon oxide film. Contact holes 101 and 102 are opened through the first interlayer insulating film 10 at the positions corresponding to the source region 3 and the drain region 5. A source electrode 8 (a portion of the data line sig) and a drain electrode 9 composed of aluminum or an aluminum alloy are electrically connected to the source region 3 and the drain region 5, respectively, through the contact holes 101 and 102.

Also, a second interlevel insulating film 11 composed of a silicon oxide film is formed on the front surface of the source electrode 8 and the drain electrode 9, and a contact hole 103 is made through the second interlevel insulating film 11 at the position corresponding to the drain electrode 9. Thus, a transparent display electrode 12 composed of an ITO film formed on the front surface of the second interlevel insulating film 11 is electrically connected to the drain electrode 9 through the contact hole 103 in the second interlevel insulating film 11.

In a liquid crystal display device LP configured as described above, the drain region 5 composed of a polycrystalline silicon film and the drain electrode 9 composed of an aluminum film are electrically connected to each other at a first electrical connection through the contact hole 102 in the first interlevel insulating film 10. Also, the drain electrode 9 composed of an aluminum film and the transparent display electrode 12 composed of an ITO film are electrically connected to each other at a second electrical connection 32 through the contact hole 103 in the second interlevel insulating film 11.

In accordance with the present embodiment, at the first electrical connection, a titanium film 13 and a first titanium nitride film 14 are deposited interior to the contact hole 102 and around the edge of the hole in that order under the drain electrode 9, and the drain region 5 composed of a polycrystalline silicon film and the drain electrode 9 composed of an aluminum film are electrically connected to each other with the titanium film 13 and the first titanium nitride film 14 therebetween. As will be described below, after the titanium film, the titanium nitride film, and the aluminum film are formed in that order upon completion of the formation of the contact hole 102 in the first interlevel insulating film, the titanium film 13 and the first titanium nitride film 14 are subjected to patterning simultaneously, and are formed in the area completely overlapping the drain electrode 9.

Also, the source region 3 composed of a polycrystalline silicon film and the source electrode 8 composed of an aluminum film are electrically connected with each other at an electrical connection 33 through the contact hole 101 in the first interlevel insulating film 10. With the same configuration as that of the first electrical connection 31, the source region 3 composed of a polycrystalline silicon film and the source electrode 8 composed of an aluminum film are connected to each other with the titanium film 13 and the first titanium nitride film 14 therebetween. Therefore, in the following description, the first electrical connection 31 only will be mentioned.

As de scribed above, in accordance with the present embodiment, at the first electrical connection 31, since the titanium film 14 intervenes between the drain region 5 composed of a polycrystalline silicon film and the drain electrode 9 composed of an aluminum film, a silicide layer is formed from a chemical reaction between titanium and polycrystalline silicon when heat treatment is performed. Thus, the drain region 5 (polycrystalline silicon film) and the drain electrode 5 (aluminum film) are brought into ohmic contact with each other, resulting in low contact resistance.

Also, at the first electrical connection 31, the first titanium nitride film 14 intervenes between the drain region 5 composed of a polycrystalline silicon film and the drain electrode 9 composed of an aluminum film, and the first titanium nitride film 14 functions as a diffusion-prevention film. That is, silicon does not diffuse from the drain region 5 (polycrystalline silicon film) into the drain electrode 9 (aluminum film) even if the anneal process is performed at a temperature of 300° C. or more, and thus, the contact resistance at this portion remains at a low level.

Also, in accordance with the present embodiment, at the second electrical connection 32, a second titanium nitride film 15 is formed on the innermost bottom of the contact hole 103 (the surface of the drain electrode 9), and the transparent display electrode 12 composed of an ITO film and the drain electrode 9 composed of an aluminum film are electrically connected to each other with the second titanium nitride film 15 therebetween. The second titanium nitride film 15 is also formed on the surface of the source electrode 8.

As will be described below, after the aluminum film and the titanium nitride film are formed in that order upon completion of the formation of the contact hole 103 in the second interlevel insulating film 11, the second titanium nitride film 15 is subjected to patterning simultaneously, and is formed only on the surfaces of the drain electrode 9 and the source electrode 8.

As described above, in accordance with the present embodiment, since the second titanium nitride film 15 intervenes between the drain electrode 9 (aluminum film) and the transparent display electrode 12 (ITO film), the drain electrode 9 (aluminum film) and the transparent display electrode 12 (ITO film) are brought into ohmic contact with each other.

Also, in accordance with the present embodiment, the first titanium nitride film 14 and the second titanium nitride film 15 formed on the upper and lower surfaces of the drain electrode 9 composed of an aluminum film have substantially the same film thickness and the same film characteristics such as the crystal structure and the percentage composition of titanium and nitrogen. Therefore, with respect to the drain electrode 9 (aluminum film), stress caused by the first titanium nitride film 14 and stress caused by the second titanium nitride film 15 are substantially equal, and thus, the drain electrode 9 is not subjected to unnecessary forces. Accordingly, defects such as cracks and separation do not occur in the first titanium nitride film 14, the drain electrode 9, and the second titanium nitride film 15.

Among the fabrication steps of the liquid crystal display device having the connection configuration as described above, a method for fabricating the TFT 30 for switching pixels will be described with reference to FIGS. 6(A) through 6(D).

Figure 6:
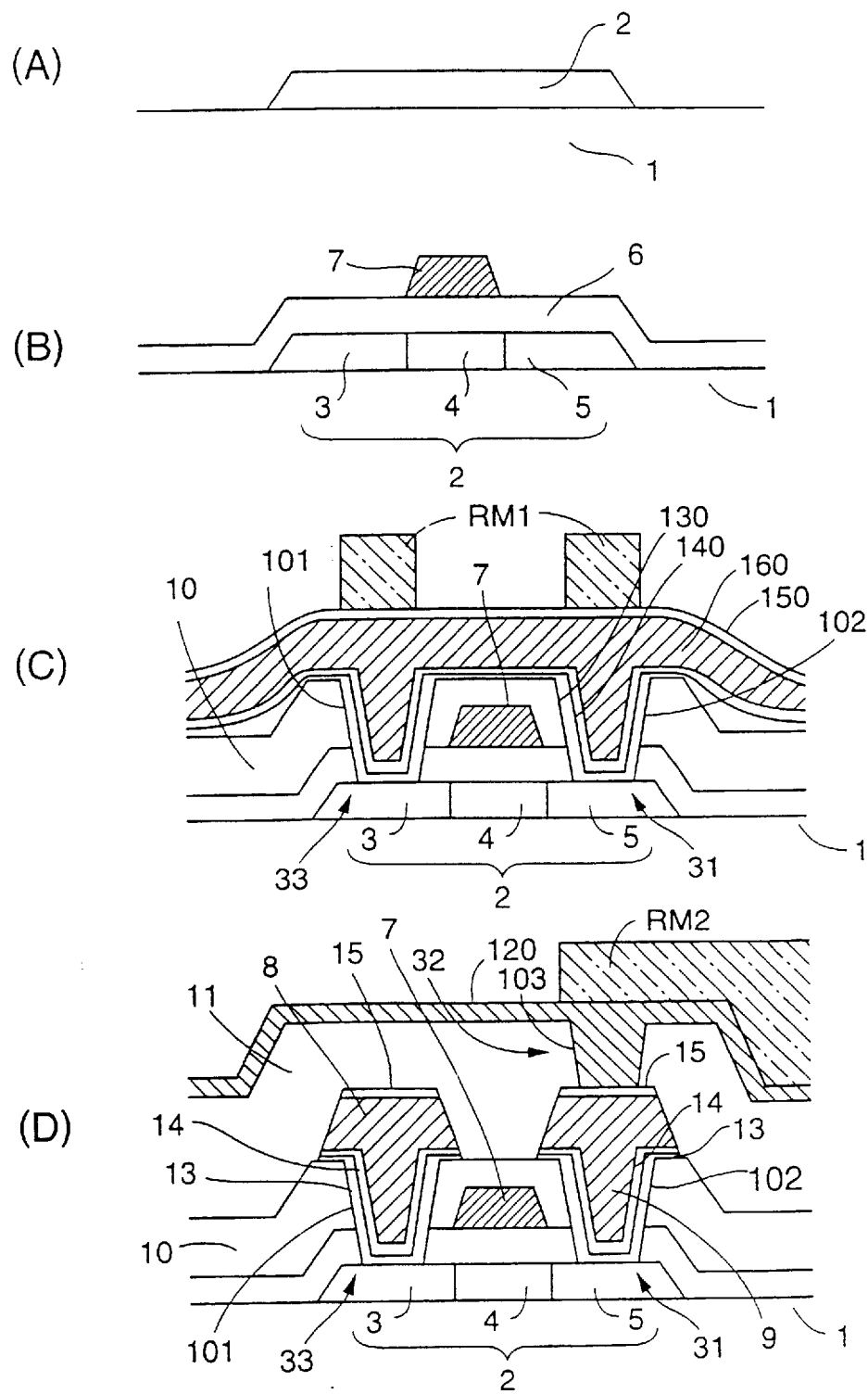
FIGS. 6(A) through 6(D) are sectional views showing step by step a method for fabricating the TFT for switching pixels shown in FIG. 4.

First, as shown in FIG. 6(A), an island-like polycrystalline silicon film 2 is formed on a substrate 1. To that end, after an amorphous silicon film is formed on the substrate 1, the amorphous silicon is modified to a polycrystalline silicon film by laser annealing or lamp annealing, and then, the polycrystalline silicon film is patterned into islands by means of photolithography.

Next, as shown in FIG. 6(B), a gate oxide film 6 is formed on the entire surface of the substrate 1. Then, after a tantalum film (Ta) and the like are formed on the entire surface of the substrate 1, a gate electrode 7 is formed by patterning the tantalum film by means of photolithography. Next, by doping impurities into the polycrystalline silicon film 2 with the gate electrode 7 as a mask, a source region 3 and a drain region 5 are formed by self-alignment with the gate electrode 7. The region into which impurities have not been doped will be a channel region 4.

Next, as shown in FIG. 6(C), a first interlevel insulating film 10 composed of a silicon oxide film is formed on the entire surface of the substrate 1. Then, contact holes 101 and 102 are made in the first interlevel insulating film 10 at the areas corresponding to the source region 3 and the drain region 5, respectively. Next, a titanium film 130, a titanium nitride film 140 having a hexagonal crystal structure for constituting a first titanium nitride film 14, an aluminum film 160 composed of aluminum or an aluminum alloy containing copper for constituting a source electrode 8 and a drain electrode 9, and a titanium nitride film 150 having a hexagonal crystal structure for constituting a second titanium nitride film 15, four layers in total, are continuously deposited in that order by sputtering without being released to open air. For example, when the titanium film 130 is sputtered, sputtering is performed in the argon atmosphere with titanium as a target. When the aluminum film 160 is sputtered, sputtering is performed in the argon atmosphere with a 99.5% aluminum alloy containing 0.5% copper as a target. When the titanium nitride films 140 and 150 are sputtered, in the atmosphere of a gaseous mixture of argon and nitrogen with titanium as a target.

The thickness of the titanium film 130 (titanium film 13) is approximately 100 to 800 Å, for example 200 Å. The thickness of the titanium nitride film 140 (first titanium nitride film 14) is approximately 500 to 1,000 Å, for example, 500 Å. The thickness of the titanium nitride film 150 (second titanium nitride film 15) is approximately 500 to 1,000 Å, for example, 500 Å. Also, the titanium nitride films 140 and 150 can be deposited by reactive sputtering in which a titanium material is sputtered in the atmosphere of a mixture of argon and nitrogen. When the titanium nitride films 140 and 150 are deposited by sputtering, titanium nitride films having different film characteristics can be obtained in response to the power, pressure, and a mixture ratio between argon and nitrogen during deposition, and in accordance with the present embodiment, the deposition conditions are set so that the titanium nitride films 140 and 150 have a hexagonal crystal structure.

Next, a resist mask RM1 is formed on the surface of the titanium nitride film 150 which lies in the outermost layer, and by using the resist mask RM1, the titanium film 130, the titanium nitride film 140, the aluminum film 160, and the titanium nitride film 150, four layers in total, are patterned simultaneously by dry-etching. As a result, as shown in FIG. 6(D), the titanium film 13, the first titanium nitride film 14, the drain electrode 9, the source electrode 8, and the second titanium nitride film 15 are formed simultaneously.

Next, a second interlevel insulating film 11 composed of a silicon oxide film is formed on the entire surface of the substrate 1. Then, a contact hole 103 is made in the area of the second interlevel insulating film 11 corresponding to the drain electrode 9. After an ITO film 120 is formed on the entire surface of the second interlevel insulating film 11, a resist mask RM2 is formed on the surface of the ITO film 120. Next, the ITO film 120 is patterned by using the resist mask RM2 and an etchant containing bromine to form a transparent display electrode 12 as shown in FIG. 5.

When the liquid crystal display device LP is fabricated as described above, in accordance with the present embodiment, the deposition conditions of the titanium nitride films 140 and 150 (first and second titanium nitride films 14 and 15) are set in response to the investigation results which will be described below, and the first and the second titanium nitride films 14 and 15 are composed of a titanium nitride film having a hexagonal crystal structure.

Figure 7:
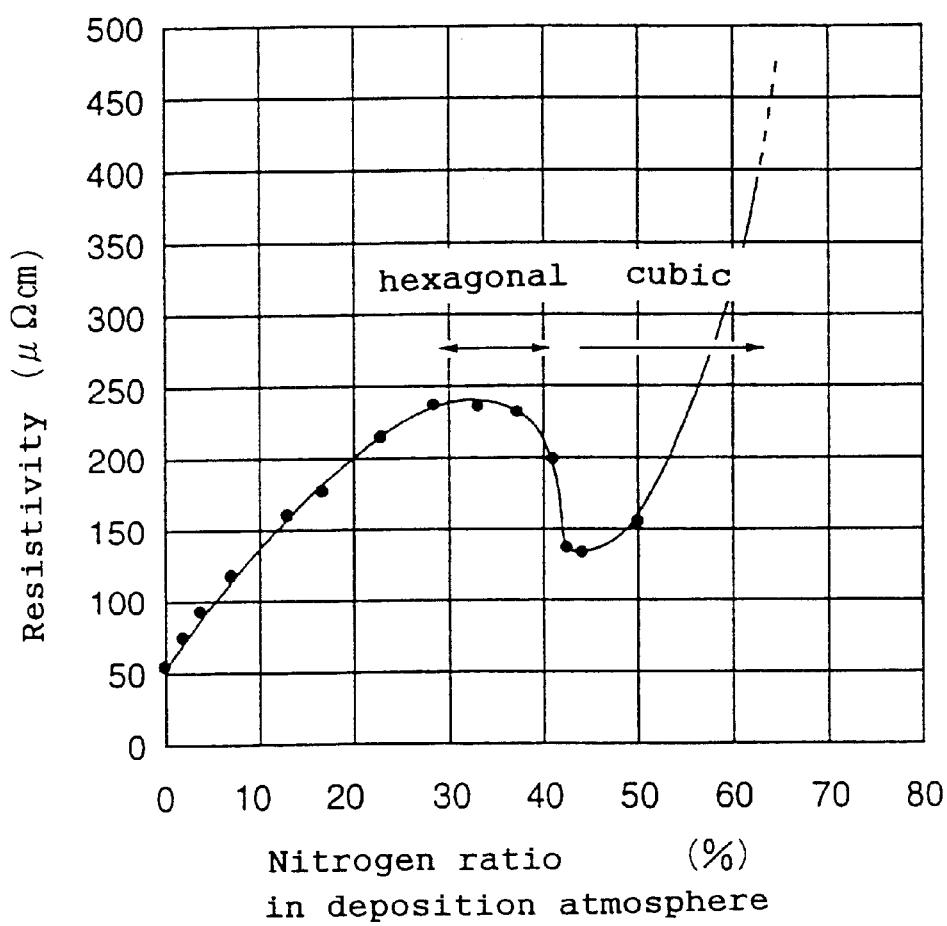
FIG. 7 is a graph showing an example of the relationships between the depositing conditions of a titanium nitride film (nitrogen ratio in the deposition atmosphere) and resistivity of the titanium nitride film.
Figure 8:
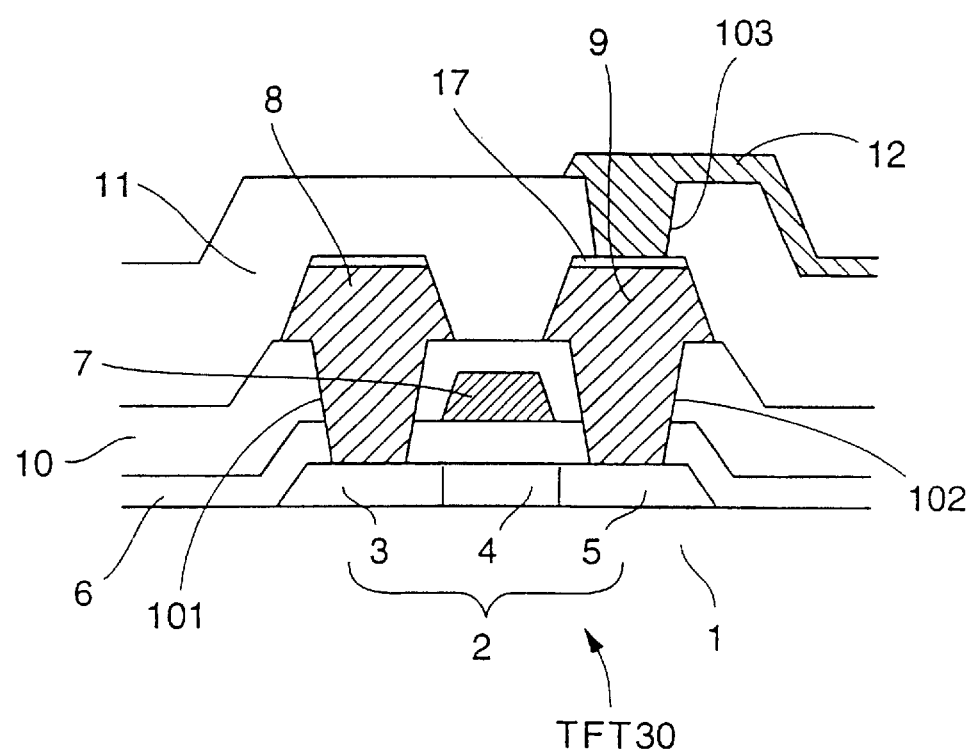
FIG. 8 is a sectional view of a TFT for switching pixels formed in a conventional liquid crystal display device.

FIG. 7 is an example of a graph showing the relationships between the nitrogen ratio in the deposition atmosphere and resistivity of the titanium nitride film when sputtering deposition is performed.

As shown in FIG. 7, resistivity of the titanium nitride film increases as the nitrogen ratio in the deposition atmosphere increases. If the nitrogen ratio in the deposition atmosphere further increases, resistivity decreases once and then increases again. As described above, resistivity of the titanium nitride film varies in response to the nitrogen ratio in the deposition atmosphere and the modification in the crystal structure of the titanium nitride film. Herein, the inventor has found that the nitrogen content in the titanium nitride film increases as the nitrogen volume in the deposition atmosphere increases, and the crystal structure changes from an amorphous state to a hexagonal crystal structure and further to a cubic crystal structure. The titanium nitride film having a hexagonal crystal structure can be obtained when the nitrogen ratio in the deposition atmosphere ranges from 20 to 40%, and if the nitrogen ratio exceeds 40%, the crystal structure changes to a cubic crystal structure. However, the crystal structure changes also in response to other deposition conditions such as the pressure or power at the time of deposition, and thus, the nitrogen ratio in the deposition atmosphere is not limited to 20 to 40%. For example, if the deposition velocity is reduced by decreasing the power, the desired crystal structure can be obtained under the conditions in which the nitrogen ratio in the deposition atmosphere is more reduced.

The effect that the titanium nitride film (first titanium nitride film 14) prevents silicon from diffusing into the aluminum films (source electrode 8 and drain electrode 9) can be obtained by a titanium nitride film having any crystal structure. Therefore, for the first titanium nitride film 14, the deposition conditions in which the titanium nitride film having low resistivity is obtainable may be set among the deposition conditions shown in FIG. 7.

Also, the stability to an etchant (etching resistance) of the titanium nitride film (second titanium nitride film 15) tends to depend on the film characteristics of the titanium nitride film. For example, resistance to buffered hydrofluoric acid (BHF) which is used as an etchant for a silicon oxide film can be obtained by the titanium nitride film having a hexagonal crystal structure or a cubic crystal structure. Such a tendency is not limited to buffered hydrofluoric acid as an etchant, but applies to the general hydrofluoric acid-based etchant. For example, the titanium nitride film having a hexagonal crystal structure or a cubic crystal structure also has resistance to hydrogen bromide which is an etchant for the ITO film. Therefore, the titanium nitride film having a hexagonal crystal structure or a cubic crystal structure can also protect aluminum or an aluminum alloy which is not resistant to hydrogen bromide. That is, if etching resistance alone is desired for the titanium nitride film (second titanium nitride film 15), the second titanium nitride film 15 may be deposited so that it has a hexagonal crystal structure or a cubic crystal structure, and if such a titanium nitride film is used, the aluminum film (drain electrode 9) can be protected from the hydrofluoric acid-based etchant when the contact hole 103 is made into the second interlevel insulating film 11. Also, when the transparent display electrode 12 is formed from the ITO film 120, even if the second interlevel insulating film 11 has cracks or the like, the aluminum films (source electrode 8 and drain electrode 9) can be protected from a bromine-based etchant.

However, it has been found that contact resistance between the ITO film (transparent display electrode 12) and titanium nitride (second titanium nitride 15) varies significantly in response to the film characteristics of titanium nitride. That is, it has been found by the investigation of the present inventor that as a titanium nitride film having a hexagonal crystal structure changes to a titanium nitride film having a cubic crystal structure, the contact resistance to the ITO film increases by approximately 100 to 1,000 times, and also, ohmic contact changes to non-ohmic contact. Therefore, in order to form the second titanium nitride film 15 as a contact material with the ITO film and the aluminum film, the deposition conditions must be set so that the titanium nitride does not have a cubic crystal structure, i.e., it has a hexagonal crystal structure. In accordance with the present embodiment, titanium nitride having a hexagonal crystal structure is used as the second titanium nitride film 15, ohmic contact between the aluminum film (drain electrode 9) and the ITO film (transparent display electrode 12) can be maintained, and also the wiring layers (source electrode 8 and drain electrode 9) can be protected.

Also, in the device fabrication process, in view of the stability at the time of forming the titanium nitride film and the miniaturization of the deposition apparatus, preferably a film to be intervened between the polycrystalline silicon films (drain region 4 and source region 3) and the aluminum films (drain electrode 9 and source electrode 8), and a film to be intervened between the aluminum film (drain electrode 9) and the ITO film (transparent display electrode 12) are composed of the same material and have the same film characteristics. That is, although molybdenum could be the contact metal between the ITO film and the aluminum film, taking the device fabrication process into consideration, preferably the first titanium nitride film 14 for preventing diffusion and the second titanium nitride film 15 for contact are formed with the same material. Also, in view of the stabilization of the deposition conditions, even when the same film is deposited, preferably the deposition conditions are the same.

In accordance with the present embodiment, the titanium nitride films (first and second titanium nitride films 14 and 15), which can be deposited with the same target as that of the titanium film 13, are formed between the polycrystalline silicon films (drain region 4 and source region 3) and the aluminum films (drain electrode 9 and source electrode 8) and between the aluminum film (drain electrode 9) and the ITO film (transparent display electrode 12), and also, with respect to the first and the second titanium nitride films 14 and 15, the titanium nitride film having a hexagonal crystal structure is formed with the nitrogen ratio in a range of 20 to 40%. Therefore, in accordance with the present embodiment, since the first titanium nitride film 14 for preventing diffusion and the second titanium nitride film 15, which is resistant to various etchants and which is capable of coming into ohmic contact with the ITO film, are formed under the same deposition conditions, the control of the conditions during deposition is facilitated.

Thence, in accordance with the present embodiment, under the stable fabrication process, the first titanium nitride film 14 can be intervened between the polycrystalline silicon film (drain region 5 and source region 4) and the aluminum film (drain electrode 9 and source electrode 8), the diffusion of silicon from the polycrystalline silicon film into the aluminum film can be securely prevented. Also, in accordance with the present embodiment, under the stable fabrication process, since the second titanium nitride film 15 can be intervened between the ITO film (transparent display electrode 12) and the aluminum film (drain electrode 9), the ITO film and the aluminum film can be securely brought into ohmic contact with each other.

Also, since the second titanium nitride film 15 having a hexagonal crystal structure is formed on the surface of the aluminum film (drain electrode 9), when the contact hole 103 is made in the second interlevel insulating film 11 by using a hydrofluoric acid-based etchant, what is exposed on the bottom of the contact hole 103 upon completion of etching is the second titanium nitride film 15, not the aluminum film (drain electrode 9). Thus, when the contact hole 103 is made into the second interlevel insulating film 11, etching does not affect the aluminum film (drain electrode 9). Also, when the transparent electrode 12 is formed by patterning the ITO film 120 by means of a bromine-based etchant, since the aluminum films (drain electrode 9 and source electrode 8) do not touch the etchant, disconnection or the like does not occur in the aluminum films. Therefore, in accordance with the present embodiment, the reliable liquid crystal display device LP can be fabricated.

Also, in accordance with the present embodiment, the titanium nitride film which can be deposited with the same target is used between the polycrystalline silicon film and the aluminum film and between the aluminum film and the ITO film, and also the first titanium nitride film and the second titanium nitride film have a hexagonal crystal structure by setting the nitrogen ratio in a range of 20 to 40%. Thus, since the first titanium nitride film 14 for diffusion-prevention and for contact and the second titanium nitride film 15 are formed from the same material, as targets for sputtering deposition, two targets only may be required to be prepared, that is, aluminum or an aluminum alloy for forming the source electrode 8 and the drain electrode 9, and titanium for forming the titanium film 13, the first titanium nitride film 14, and the second titanium nitride film 15. Also, when the titanium film 130, the titanium nitride film 140, the aluminum film 160, and the titanium nitride film 150 are formed, the four layers are preferably deposited continuously without being released to open air in view of the prevention of contamination and change in quality of the individual films. If the required targets for sputtering deposition are only two as described above, the large-sized deposition systems will not be required.

Although, in the embodiment described above, an example in which the first and the second titanium nitride films 14 and 15 have a hexagonal crystal structure has been described, the first and the second titanium nitride films 14 and 15 may be amorphous, or may be the titanium nitride films deposited under the deposition conditions which is similar to those in which a hexagonal crystal structure is produced.

Also, a CMOS circuit is formed on the active matrix substrate AM by using N-type and P-type TFTs. A method for fabricating these driving TFTs is basically the same as that for fabricating TFTs for switching pixels, and thus, description will be omitted. However, if the present invention is applied to the TFTs for drive circuits, of course, electrodes or wiring can be brought into ohmic contact.

INDUSTRIAL APPLICABILITY

As described above, in accordance with the present invention, the first titanium nitride film intervenes between the polycrystalline silicon film and the aluminum film, and the first titanium nitride film functions as a diffusion-prevention film, and thus, the contact resistance at this portion can be maintained at a low level. Also, since the second titanium nitride film intervenes between the aluminum film and the transparent display electrode composed of an ITO film, the transparent display electrode and the aluminum film can be brought into ohmic contact with each other. Also, since the second titanium nitride film is formed on the surface of the aluminum film, the aluminum film can be protected from etchants when the contact hole is made into the interlevel insulating film and the ITO film is patterned. Also, if the same titanium nitride film is provided between the polycrystalline silicon film and the aluminum film and between the aluminum film and the transparent display electrode (ITO film), deposition can be performed with the same target when the sputtering process is used for deposition. Therefore, as targets for sputtering deposition, two targets only are required, that is, a target for forming the aluminum film and a target for forming the titanium nitride (titanium) film.

What is claimed is:

1. A display device comprising:
   a polycrystalline silicon film;
   an aluminum film formed over said polycrystalline silicon film;
   a first electrical connection formed between said polycrystalline silicon film and said aluminum film, said first electrical connection comprising a first titanium nitride film provided between said polycrystalline silicon film and said aluminum film;
   an interlevel insulating film formed over said aluminum film;
   a transparent display electrode formed over said interlevel insulating film and through a contact hole formed in said interlevel insulating film; and
   a second electrical connection formed between said aluminum film and said transparent display electrode, said second electrical connection comprising a second titanium nitride film provided between said aluminum film and said transparent display electrode,
     wherein said first titanium nitride film and said second titanium nitride film having a same film thickness and the same film characteristics.

2. The displace device according to claim 1, said polycrystalline silicon film and said aluminum film being formed on one of a pair of substrates sandwiching a liquid crystal material.

3. A method of forming a display device, comprising:
   forming a polycrystalline silicon film;
   forming an aluminum film over said polycrystalline silicon film;
   forming a first electrical connection between said polycrystalline silicon film and said aluminum film, said first electrical connection comprising a first titanium nitride film provided between said polycrystalline silicon film and said aluminum film;
   forming an interlevel insulating film over said aluminum film;

forming a transparent display electrode over said interlevel insulating film and through a contact hole formed in said interlevel insulating film; and forming a second electrical connection between said aluminum film and said transparent display electrode, said second electrical connection comprising a second titanium nitride film provided between said aluminum film and said transparent display electrode, wherein said first titanium nitride film and said second titanium nitride film being formed with a same film thickness and the same film characteristics.

4. A display device, comprising:

a polycrystalline silicon film;

an aluminum film formed over said polycrystalline silicon film;

a first electrical connection formed between said polycrystalline silicon film and said aluminum film, said first electrical connection comprising a first titanium nitride film provided between said polycrystalline silicon film and said aluminum film;

an interlevel insulating film formed over said aluminum film;

a transparent display electrode formed over said interlevel insulating film and through a contact hole formed in said interlevel insulating film; and a second electrical connection formed between said aluminum film and said transparent display electrode, said second electrical connection comprising a second titanium nitride film provided between said aluminum film and said transparent display electrode;

wherein said first titanium nitride film and said second titanium nitride film being formed with a same film characteristics.

5. A method of forming a display device, comprising:

forming a polycrystalline silicon film;

forming an aluminum film formed over said polycrystalline silicon film;

forming a first electrical connection formed between said polycrystalline silicon film and said aluminum film, said first electrical connection comprising a first titanium nitride film provided between said polycrystalline silicon film and said aluminum film;

forming an interlevel insulating film over said aluminum film;

forming a transparent display electrode over said interlevel insulating film, and through a contact hole formed in said interlevel insulating film; and forming a second electrical connection formed between said aluminum film and said transparent display electrode, said second electrical connection comprising a second titanium nitride film provided between said aluminum film and said transparent display electrode;

wherein said first titanium nitride film and said second titanium nitride film being formed with a same film characteristics.

* * * * *